(12) United States Patent
Yu

(10) Patent No.: US 7,110,429 B2
(45) Date of Patent: Sep. 19, 2006

(54) DISTRIBUTED FEEDBACK LASER

(75) Inventor: Joon-Sang Yu, Yongin-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 230 days.

(21) Appl. No.: 10/629,096

(22) Filed: Jul. 28, 2003

(65) Prior Publication Data

US 2004/0161007 A1 Aug. 19, 2004

(30) Foreign Application Priority Data

Feb. 13, 2003 (KR) .................... 10-2003-0009150

(51) Int. Cl.
*H01S 3/08* (2006.01)

(52) U.S. Cl. .......................................... 372/96; 385/45

(58) Field of Classification Search ................ 372/96; 385/45

See application file for complete search history.

(56) References Cited

U.S. PATENT DOCUMENTS

| 4,515,428 | A | * | 5/1985 | Findakly ...................... 385/46 |
| 5,642,371 | A | * | 6/1997 | Tohyama et al. ........ 372/45.01 |
| 5,787,105 | A | * | 7/1998 | Okamoto et al. ............. 372/50 |
| 2002/0037024 | A1 | * | 3/2002 | Huang ........................ 372/50 |

FOREIGN PATENT DOCUMENTS

JP 55-032036 3/1980
JP 09-148548 6/1997

\* cited by examiner

*Primary Examiner*—Minsun O. Harvey
*Assistant Examiner*—Tod T. Van Roy
(74) *Attorney, Agent, or Firm*—Cha & Reiter, L.L.C.

(57) ABSTRACT

A distributed feedback laser comprising a guide layer is disclosed and includes a plurality of waveguides connected in a stepped multi-branch structure, the guide layer serving as a transmission medium for light having a predetermined wavelength, and an active layer, formed on the guide layer, for oscillating light, wherein light is branched according to a predetermined ratio while proceeding from a higher waveguide to a lower waveguide within the guide layer.

4 Claims, 4 Drawing Sheets

DISTRIBUTED FEEDBACK LASER

CLAIM OF PRIORITY

This application claims priority to an application entitled "Distributed feedback laser," filed in the Korean Intellectual Property Office on Feb. 13, 2003 and assigned Serial No. 2003-9150, the contents of which are hereby incorporated by reference.

BACKGROUND OF THE INVENTION

1. Field of the Invention

The present invention relates to a semiconductor laser, and more particularly to a distributed feedback laser.

2. Description of the Related Art

A conventional distributed feedback laser, which operates with a spectrum of a single wavelength, is suitable for long distance and high-speed data transmission. However, one disadvantage of such a distributed feedback laser is that its optical feedback characteristic is relatively poor as compared to a Fabry-Perot laser. For that reason, such a distributed feedback laser module, when used for long distance transmission, has a built-in optical isolator in order to prevent laser instability caused by optical feedback. The optical isolator is an expensive device, and thus accounts for much of the module price. If a distributed feedback laser that is not sensitive to optical feedback can be realized, the optical isolator would not be needed. Accordingly, the manufacture of the distributed feedback laser module would have a much lower cost. In general, a distributed feedback laser module that is operated at a speed of over 2.5 Gps has a built-in optical isolator. The optical isolator generally comprises a first and a second polarizer, and a Faraday rotator interposed between the polarizers. The polarization direction of the second polarizer precedes that of the first polarizer clockwise by 45 degrees. That is, after light, which is inputted to the optical isolator in forward direction, is polarized through the first polarizer, the polarization direction of the light is rotated clockwise 45 degrees by the Faraday rotator. The light (the polarization direction of which has rotated) passes through the second polarizer. Also, after light, which is inputted to the optical isolator in backward direction, is polarized through the second polarizer (the polarization direction of the light is rotated clockwise 45 degrees by the Faraday rotator). Then, the light having passed the Faraday rotator, unlike the case of the forward light, radiates at 90 degrees to the polarization direction of the first polarizer, so that the light is completely shut out by the first polarizer.

As described above, the prior art distributed feedback laser module must comprise a high priced optical isolator in order to shut out optical feedback. Therefore, it has a disadvantage in that the manufacturing cost of the distributed feedback laser module is very high.

SUMMARY OF THE INVENTION

Accordingly, the present invention has been made to reduce or overcome the above-mentioned problems occurring in the prior art, and provides additional advantages by providing a distributed feedback laser which is not sensitive to optical feedback and thereby the manufacture cost of the entire module can be reduced as compared to the prior art.

In accordance with the principles of the present invention a distributed feedback laser is provided comprising a guide layer including a plurality of waveguides connected in a stepped multi-branch structure, the guide layer serving as a transmission medium for light having a predetermined wavelength, and an active layer, formed on the guide layer, for oscillating light, wherein light is branched according to a predetermined ratio while proceeding from a higher waveguide to a lower waveguide within the guide layer.

BRIEF DESCRIPTION OF THE DRAWINGS

The present invention will be more apparent from the following detailed description taken in conjunction with the accompanying drawings, in which.

DETAILED DESCRIPTION OF THE PREFERRED EMBODIMENT

Hereinafter, a distributed feedback laser according to preferred embodiments of the present invention will be described with reference to the accompanying drawings. For the purposes of clarity and simplicity, a detailed description of known functions and configurations incorporated herein will be omitted as it may make the subject matter of the present invention unclear.

Figure 1:
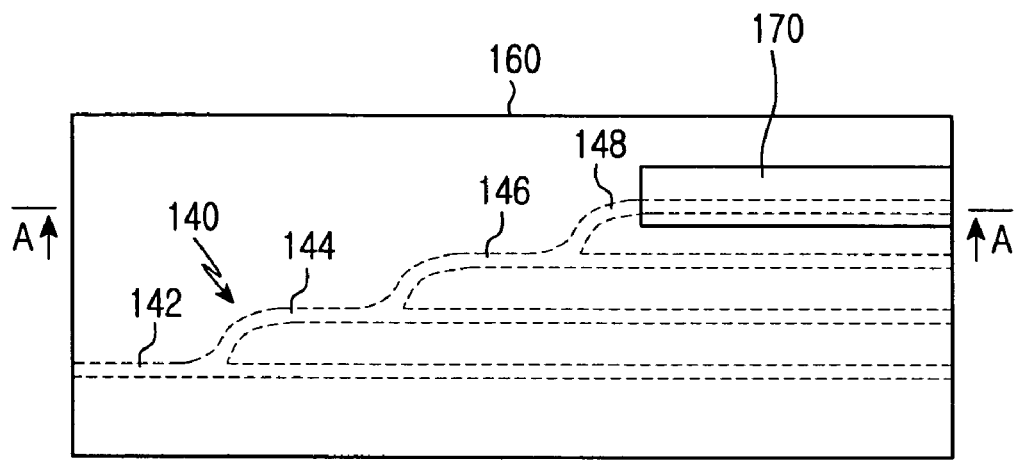
FIG. 1 is a top view of a distributed feedback semiconductor laser according to a preferred embodiment of the present invention.
Figure 2:
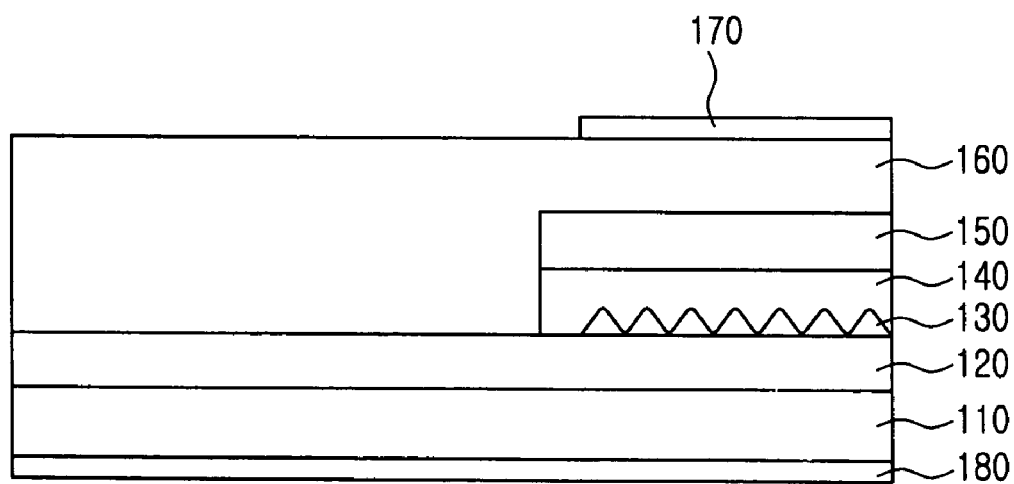
FIG. 2 is a side sectional view taken along line A—A in the distributed feedback semiconductor laser of FIG. 1.

FIG. 1 is a top view of a distributed feedback semiconductor laser according to a preferred embodiment of the present invention. FIG. 2 is a side sectional view taken along line A—A in the distributed feedback semiconductor laser of FIG. 1. The distributed feedback semiconductor laser includes a semiconductor substrate 110, upper and lower clad layers 120 and 160, a grating 130, a guide layer 140, an active layer 150, an upper electrode 170 and a lower electrode 180.

Lower clad layer 120 is formed on semiconductor substrate 110, and performs, with upper clad layer 160, the function of confining the light generated in the distributed feedback semiconductor laser within the inside.

Grating 130 is formed in a selected area on lower clad layer 120 and has a predetermined period. The wavelength of distributed-feedback is determined according to the grating period.

Guide layer 140 is formed on grating 130 and lower clad layer 120, serves as a transmission medium for light generated in the distributed feedback semiconductor laser. As shown in FIG. 1, guide layer 140 has a stepped multi-branch structure (e.g. a hierarchal Y-structure) comprising a first to a fourth waveguide 142, 144, 146 and 148.

In operation, light that is inputted to first waveguide (the highest waveguide) 142 reaches fourth waveguide 148 after undergoing branch processes three times. Then, the light which proceeds from a higher waveguide to a lower waveguide is branched in the ratio of ten to one, while other light which proceeds a lower waveguide to a higher waveguide passes without any loss in the ratio of one to one.

Grating 130 is interposed between fourth waveguide 148 and lower clad layer 120.

Active layer 150 is formed on guide layer 140, has a multiple quantum well structure, and oscillates lights according to inputted electric currents.

Upper clad layer 160 is formed on both active layer 150 and lower clad layer 120, and upper electrode 170 is formed on upper clad layer 160. Upper electrode 170 is arranged along fourth waveguide 148.

Figure 3A:
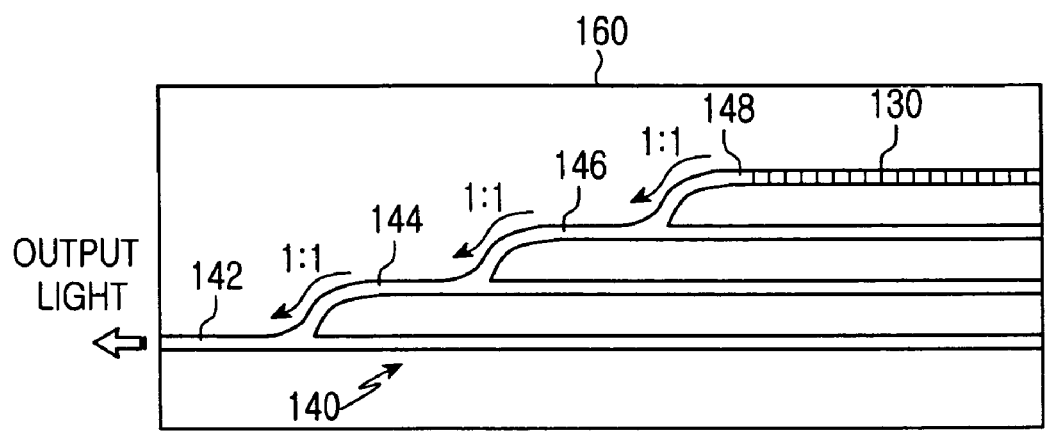
FIG. 3a to 3b are views for describing input and output properties of light at a guide layer shown in FIG. 1.
Figure 3B:
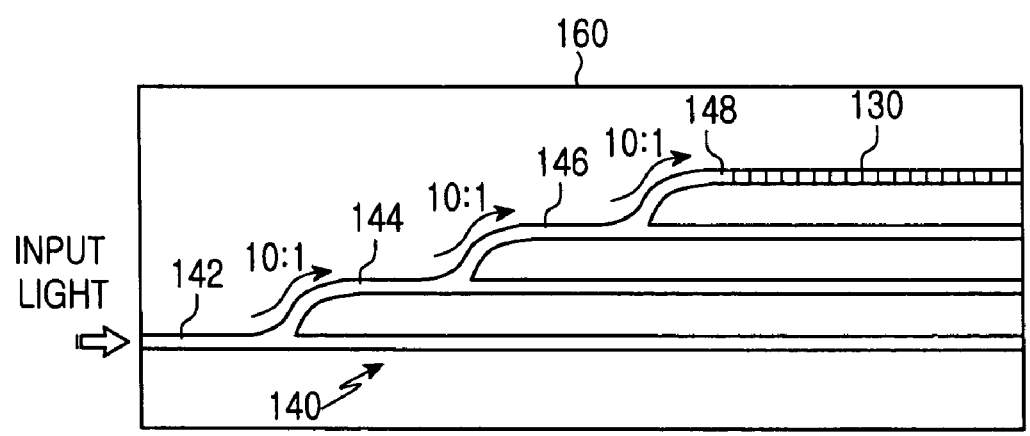

FIGS. 3a to 3b are views for describing the input and output properties of light at the guide layer shown in FIG. 1. Referring to FIG. 3a, light generated from fourth waveguide 148 is outputted after passing through the third to the first waveguides 146, 144 and 142 in sequence. Then, because the light proceeds from a lower waveguide to a higher waveguide without any loss, the light generated from fourth waveguide 148 is outputted without any loss. Referring to FIG. 3b, light inputted from the outside to first waveguide 142 is inputted to fourth waveguide 148 after passing through second and third waveguides 144 and 146 in sequence. Then, as the light proceeds from a higher waveguide to a lower waveguide in the branch ratio of ten to one, light having about 0.1% of an initial power is inputted into fourth waveguide 148. That is, the intensity of feedback light is minimized; thus, it can be seen that the distributed feedback semiconductor laser is not significantly affected by feedback of light.

FIGS. 4 to 8 are views for describing manufacturing process of the distributed feedback semiconductor laser shown in FIG. 1.

Figure 4:
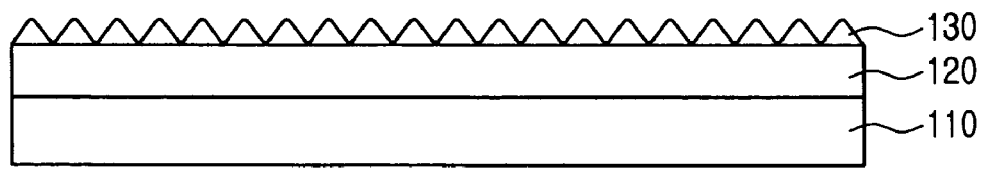
FIGS. 4 to 8 are views for describing the manufacturing process of the distributed feedback semiconductor laser shown in FIG. 1.

Referring to FIG. 4, a lower clad layer 120 of n-type InP is formed on a semiconductor substrate 110 of n-type InP, and a grating 130 having a predetermined period is formed on the lower clad layer 120. Then, the photolithography process may be used as a method forming grating 130. That is, a photoresist layer (not shown) is formed on lower clad layer 120, and then exposed under a phase mask (not shown) so as to have a predetermined period. Subsequently, a photoresist mask (not shown) having the pattern of the grating is formed by developing the photoresist layer. Finally, grating 130 is formed on lower clad layer 120, through the etching process using the photoresist mask.

Figure 5:
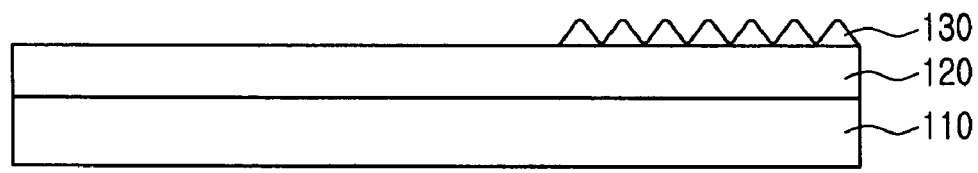

Referring to FIG. 5, only a selected area of grating 130 is left and the rest area is removed by using etching process.

Figure 6:
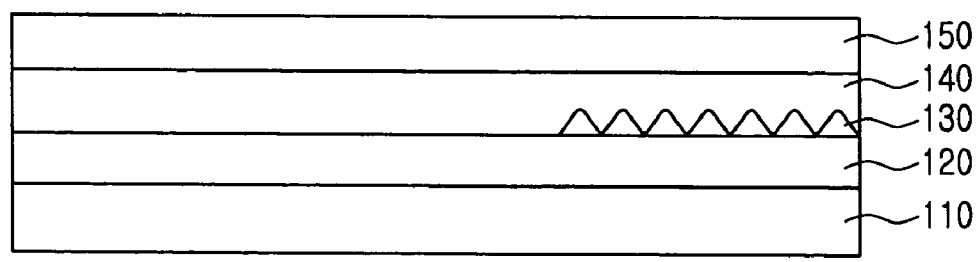

Referring to FIG. 6, a guide layer 140 of InGaAsP is formed on grating 130 and lower clad layer 120, and then an active layer 150 is formed on guide layer 140, in which active layer 150 is made of InGaAs/InGaAsP.

Figure 7:
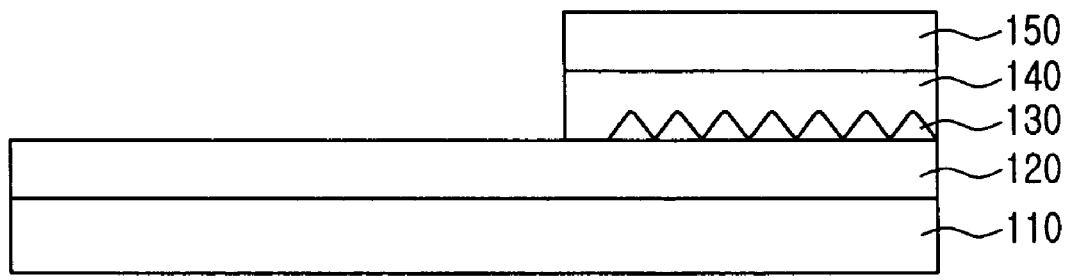

Referring to FIG. 7, guide layer 140 and active layer 150 are partially etched by using a mesa etching process so that guide layer 140 includes a first to a fourth waveguide 142, 144, 146 and 148 forming a stepped multi-branch structure as shown in FIG. 1.

Figure 8:
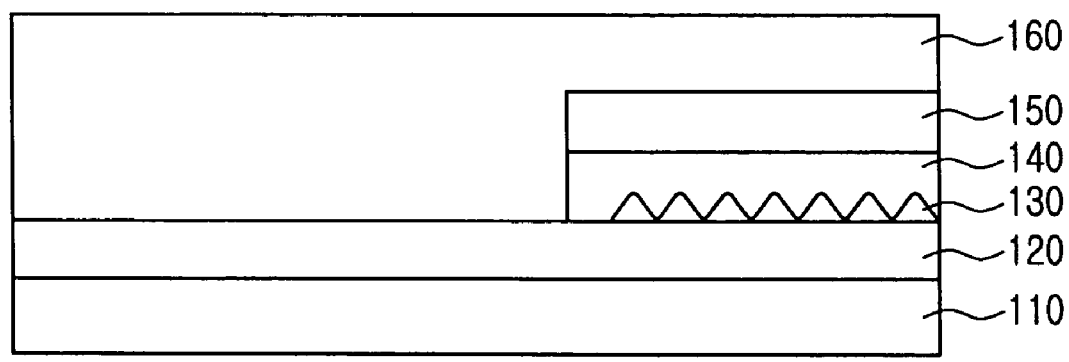

Referring to FIG. 8, an upper clad layer 160 of p-type InP is formed on lower clad layer 120 and active layer 150 so as to completely surround guide layer 140 and active layer 150.

Subsequently, an upper electrode 170 made of Ti/Pt/Au based material is formed on upper clad layer 160, which is isolated electrically from upper clad layer 160. Also, a lower electrode 180 of AuGe/Ni/Au is formed on the underside of semiconductor substrate 110. The resultant produced in this manner is shown in FIG. 2.

As described above, the distributed feedback semiconductor laser according to the present invention comprises the guide layer having a stepped multi-branch structure. Advantageously, the present invention's distributed feedback semiconductor laser is not sensitive to optical feedback. Another advantage of the present invention is that the manufacturing cost of the whole module can be reduced.

While the invention has been shown and described with reference to certain preferred embodiments thereof, it will be understood by those skilled in the art that various changes in form and details may be made therein without departing from the spirit and scope of the invention as defined by the appended claims. In addition, many modifications may be made to adapt to a particular situation and the teaching of the present invention without departing from the central scope. Therefore, it is intended that the present invention not be limited to the particular embodiment disclosed as the best mode contemplated for carrying out the present invention, but that the present invention include all embodiments falling within the scope of the appended claims.

What is claimed is:

1. The distributed feedback laser comprising:
   a guide layer having at least a higher and a lower waveguide coupled in a hierarchal Y-structure; and
   an active layer, formed on the guide layer, for oscillating light, wherein light is transmitted having a predetermined wavelength, and the light is subjected to loss, using the hierarchal Y-structure, according to a predetermined ratio while proceeding in a predetermined direction in the laser, wherein the distributed feedback laser further includes a grating that is formed under the guide layer and has a predetermined period, wherein the laser has an end intended for losslessly outputting light by means of said structure, and a highest of the waveguides in the hierarchy is disposed at said end.

2. The distributed feedback laser as claimed in claim 1, wherein the grating is formed under a lowest of the waveguides in the hierachy.

3. The distributed feedback laser as claimed in claim 1, wherein the distributed feedback laser further comprises:
   a semiconductor substrate;
   a lower clad layer interposed between the semiconductor substrate and the guide layer; and
   an upper clad layer on the active layer and the lower clad layer so as to surround the guide layer.

4. The distributed feedback laser as claimed in claim 3, wherein the distributed feedback laser further comprises:
   a upper electrode formed on the upper clad layer; and
   a lower electrode formed under the semiconductor substrate.

* * * * *